(12) United States Patent
Lin (10) Patent No.: US 8,218,282 B2
(45) Date of Patent: Jul. 10, 2012

(54) PORTABLE ELECTRONIC DEVICE AND METHOD FOR USING THE SAME

(75) Inventor: Chia-Pin Lin, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 329 days.

(21) Appl. No.: 12/618,074

(22) Filed: Nov. 13, 2009

(65) Prior Publication Data

US 2010/0329468 A1  Dec. 30, 2010

(30) Foreign Application Priority Data

Jun. 29, 2009  (CN) .......................... 2009 1 0303820

(51) Int. Cl.
*H01C 7/12* (2006.01)
*H02H 3/20* (2006.01)
*H02H 3/22* (2006.01)
*H02H 9/00* (2006.01)
*H03G 11/00* (2006.01)

(52) U.S. Cl. ......... 361/118; 361/91.1; 361/111; 361/56; 361/58; 381/55

(58) Field of Classification Search .............. 381/55, 381/58; 361/58, 91.1, 111, 118, 56
See application file for complete search history.

(56) References Cited

U.S. PATENT DOCUMENTS 5,835,328 A * 11/1998 Maloney et al. ............ 361/111
2009/0052100 A1 * 2/2009 Robb et al. .................. 361/56

* cited by examiner

*Primary Examiner* — Devona Faulk
*Assistant Examiner* — George Monikang
(74) *Attorney, Agent, or Firm* — Altis Law Group, Inc.

(57) ABSTRACT

A portable electronic device includes an audio file playing unit and a surge protector device connected to the audio file playing unit. The surge protector device includes a protector module connected to an audio file playing unit and a processor module connected to the protector module and the audio file playing unit. The processor module detects electric surges in the audio file playing unit and controls the protector module to filter the detected electric surges when the audio file playing unit plays audio files.

15 Claims, 7 Drawing Sheets

PORTABLE ELECTRONIC DEVICE AND METHOD FOR USING THE SAME

BACKGROUND

1. Technical Field

The present disclosure relates to portable electronic devices and methods for using the same, and particularly to a portable electronic device having a surge protection device and a method for using the same.

2. Description of Related Art

When portable electronic devices such as mobile phones, personal digital assistants (PDA) and laptop computers are used to play audio files, many accessories (e.g., earphones or speakers) are often connected to these portable electronic devices to output the played audio signals. Thus, the quality of the audio signals is improved. Furthermore, the played audio signals can be easily transmitted to predetermined positions.

However, when an accessory is connected to an interface of a portable electronic device, an electric potential on the interface may suddenly change, and an electric surge may be generated. Furthermore, electric surges can also be generated when the accessory outputting the audio signals is changed (e.g., selectively changed between a speaker of the portable electronic device or an earphone) or the volume of the played audio signals is adjusted. These electric surges may worsen the audio playing quality, and may also damage the portable electronic devices and the accessories.

Therefore, there is room for improvement within the art.

BRIEF DESCRIPTION OF THE DRAWINGS

Many aspects of the present portable electronic device and method for using the same can be better understood with reference to the following drawings. The components in the various drawings are not necessarily drawn to scale, the emphasis instead being placed upon clearly illustrating the principles of the present portable electronic device and method for using the same. Moreover, in the drawings, like reference numerals designate corresponding parts throughout the figures.

DETAILED DESCRIPTION

Figure 1:
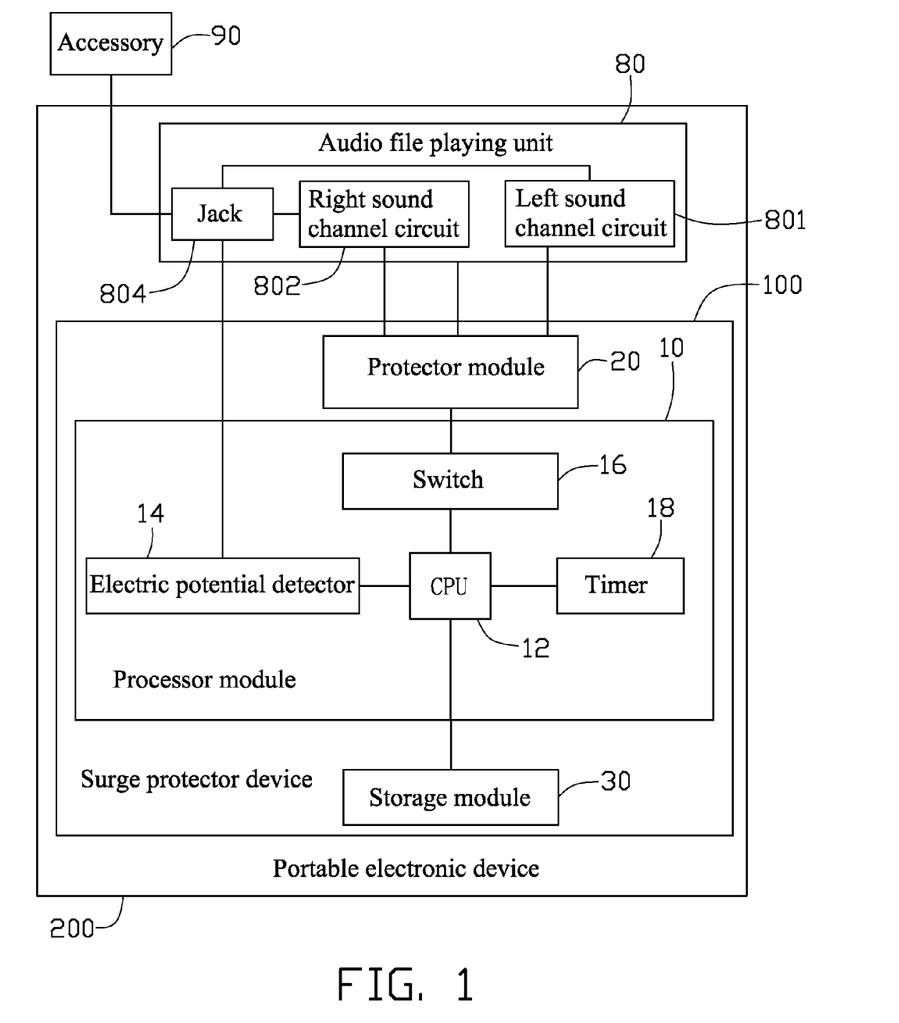
FIG. 1 is a block diagram of a portable electronic device, according to an exemplary embodiment.

FIG. 1 schematically shows a portable electronic device 200, according to an exemplary embodiment. The portable electronic device 200 can be a mobile phone, a personal digital assistant (PDA), a laptop computer, etc. The portable electronic device 200 includes a conventional audio file playing unit 80 for playing audio signals and a surge protector device 100 connected to the audio file playing unit 80 to detect and filter electric surges. The audio file playing unit 80 includes a left sound channel circuit 801, a right sound channel circuit 802 and a jack 804. The left sound channel circuit 801 and the right sound channel circuit 802 are used to transmit played audio signals via a left sound channel and a right sound channel correspondingly. The jack 804 is connected the left sound channel circuit 801 and the right sound channel circuit 802. An audio playing accessory 90 (e.g., an earphone or a speaker) can be connected to the portable electronic device 200 via the jack 804 to output played audio signals. When the portable electronic device 200 is used to play audio files, the surge protector device 100 can prevent the portable electronic device 200 from damage due to electric surges.

The surge protector device 100 includes a processor module 10, a protector module 20 and a storage module 30. The processor module 10 is electrically connected to the protector module 20 and the storage module 30.

The processor module 10 includes a central processing unit (CPU) 12, an electric potential detector 14, a switch 16 and a timer 18. The electric potential detector 14, the switch 16 and the timer 18 are all electrically connected to the CPU 12. The electric potential detector 14 is electrically connected to the audio file playing unit 80 (e.g., the jack 804) of the portable electronic device 200.

Figure 2:
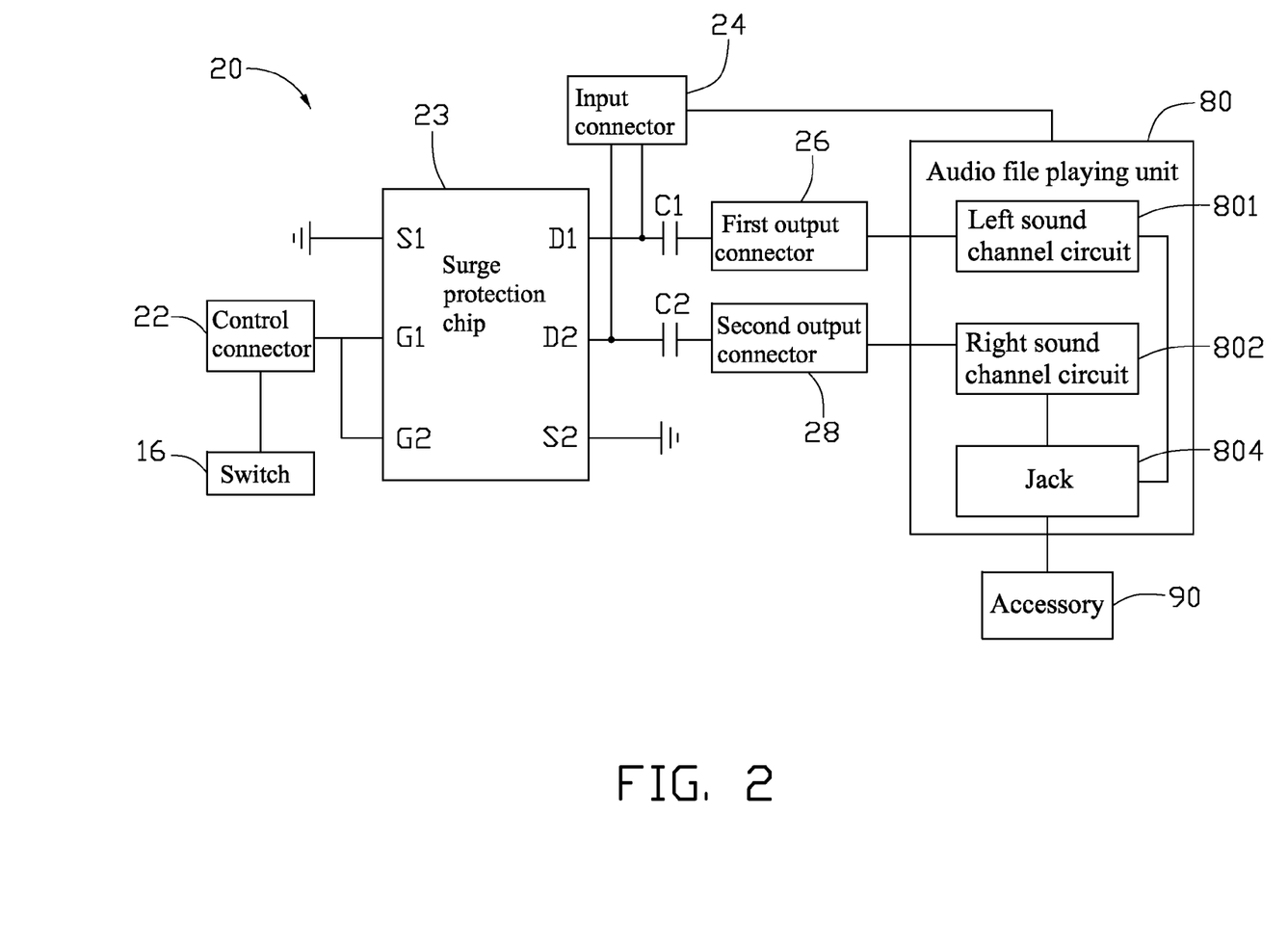
FIG. 2 is a circuit diagram of the protector module of the portable electronic device shown in FIG. 1.

Also referring to FIG. 2, the protector module 20 includes a control connector 22, a surge protection chip 23, an input connector 24, a first output connector 26, a second output connector 28, and two capacitors C1, C2. The control connector 22 is connected to the switch 16, such that the CPU 12 can control the protector module 20 via the switch 16. The surge protection chip 23 can be an NTZD3154N transistor, which has two sources S1, S2, two gates G1, G2, and two drains D1, D2. The sources 51, S2 are both grounded. The gates G1, G2 are both connected to the control connector 22 to receive control signals from the CPU 12. The capacitor C1 has one pole connected to the drain D1 and another pole connected to the first output connector 26. The capacitor C2 has one pole connected to the drain D2 and another pole connected to the second output connector 28. The input connector 24 is connected between the drain D1 and the capacitor C1, and is also connected between the drain D2 and the capacitor C2. The audio file playing unit 80 is connected to the input connector 24. The first output connector 26 and the second output connector 28 are correspondingly connected to the left and right sound channel circuits 801, 802 of the portable electronic device 200.

The storage module 30 can be a conventional storage of the portable electronic device 200. The storage module 30 stores a surge protection program. When electric surges are generated in the portable electronic device 200, the processor module 10 can detect the electric surges and determine the kind/type of electric surges. Thus, the processor module 10 selects a protection program (hereafter selected protection program) corresponding to the current electric surges, and controls the protector module 20 to filter the electric surges according to the selected protection program.

Figure 3:
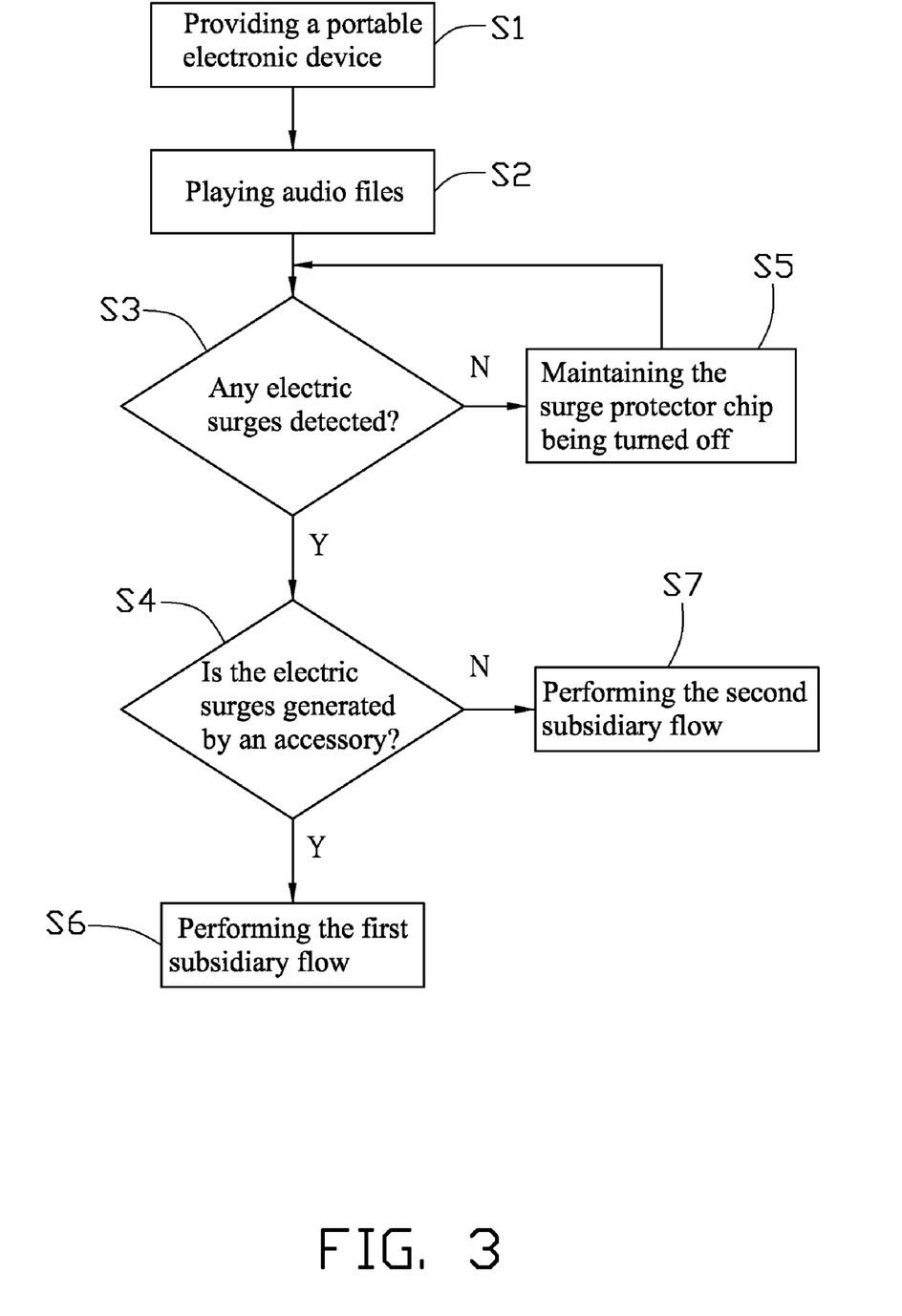
FIG. 3 is a main flow chart of a method for using the portable electronic device shown in FIG. 1, according to an exemplary embodiment.

Also referring to FIG. 3, a method for using the portable electronic device 200, according to an exemplary embodiment, is provided. According to the method, the portable electronic device 200 can be used to play audio files and synchronously filter electric surges generated in the playing process. The method may include the following steps.

First, an aforementioned portable electronic device 200 is provided (Step S1). The audio file playing unit 80 is then used to play audio files (Step S2) according to conventional methods. The played audio signals are inputted through the input connector 24, and are respectively outputted through a first path and a second path. The first path includes the capacitor C1, the first output connector 26 and the left sound channel circuit 801 connected in series, and the second path includes the capacitor C2, the second output connector 28 and the right sound channel circuit 802 connected in series.

When the portable electronic device 200 plays audio files, the surge protection chip 23 is turned off/deactivated, and the CPU 12 periodically detects the electric potential of the audio file playing unit 80 (e.g., the jack 804) with the electric potential detector 14 in a predetermined frequency or at predetermined intervals, thereby detecting electric surges (Step S3). If there are electric surges generated in the portable electronic device 200, the CPU 12 determines the kind of the current electric surges (Step S4). Particularly, if the CPU 12 detects that the electric surges are generated by the accessory 90 connected to the portable electronic device 200 (e.g., the CPU 12 detects electric surges when the accessory 90 is being connected to the jack 804), the CPU 12 performs the first subsidiary flow (Step S6). If the CPU 12 detects that the electric surges are generated by the portable electronic device 200 itself (e.g., the CPU 12 detects electric surges when changing the volume of playing audio files), the CPU 12 performs the second subsidiary flow (Step S7). If there are no electric surges, the CPU 12 keeps the surge protection chip 23 turned off/deactivated via the switch 16 (Step S5) and returns to Step S3. Thus, the played audio signals can be directly outputted from the left and right sound channel circuits 221, 222, without effects due to the surge protection chip 23.

Figure 4:
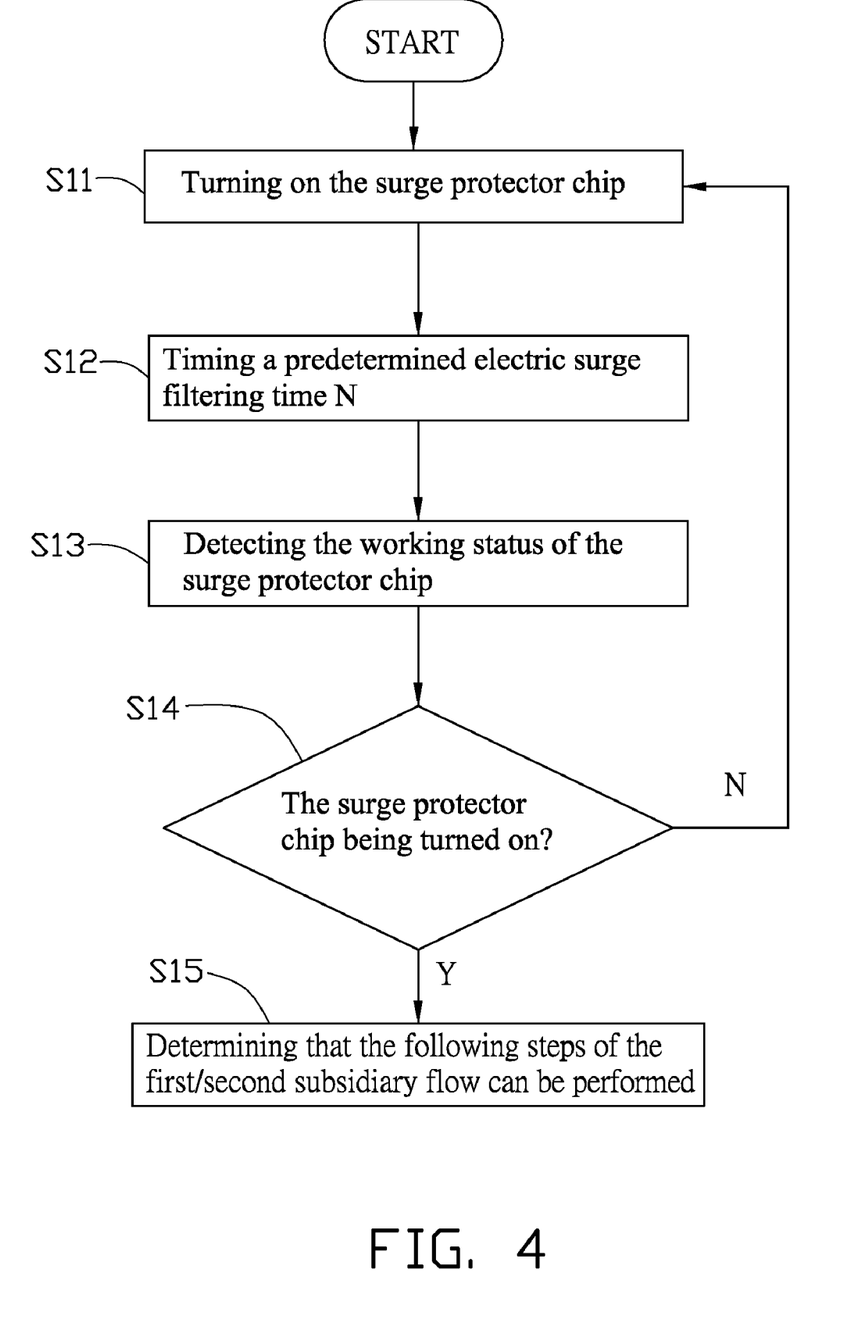
FIG. 4 is a surge filtering flow chart of the method shown in FIG. 3.

Also referring to FIG. 4, in either of the first and second subsidiary flows, a surge filtering flow needs to be performed. The surge filtering flow may include the following steps. First, the CPU 12 turns on/activates the surge protection chip 23 via the switch 16 (Step S11). Thus, the electric surges can be transmitted from the input connector 24 to the ground by the drains D1, D2 and the sources 51, S2 of the surge protection chip 23, thereby filtering electric surges from audio signals passing through the protector module 20. When the surge protection chip 23 is turned on/activates, the CPU 12 starts to synchronously time a predetermined electric surge filtering time N using the timer 18 (Step S12). In the time N, the CPU detects the status of the surge protection chip 23 via the control connector 22 in a predetermined frequency (Step S13). If the surge protection chip 23 remains being turned on/activated during the time N, the CPU 12 determines that the electric surges are continuously filtered and the following steps of the first subsidiary flow or the second subsidiary flow can be performed (Step S14). If the surge protection chip 23 is turned off within the time N, the CPU 12 determines that the electric surges has not been completely filtered and returns to the Step S11.

Figure 5:
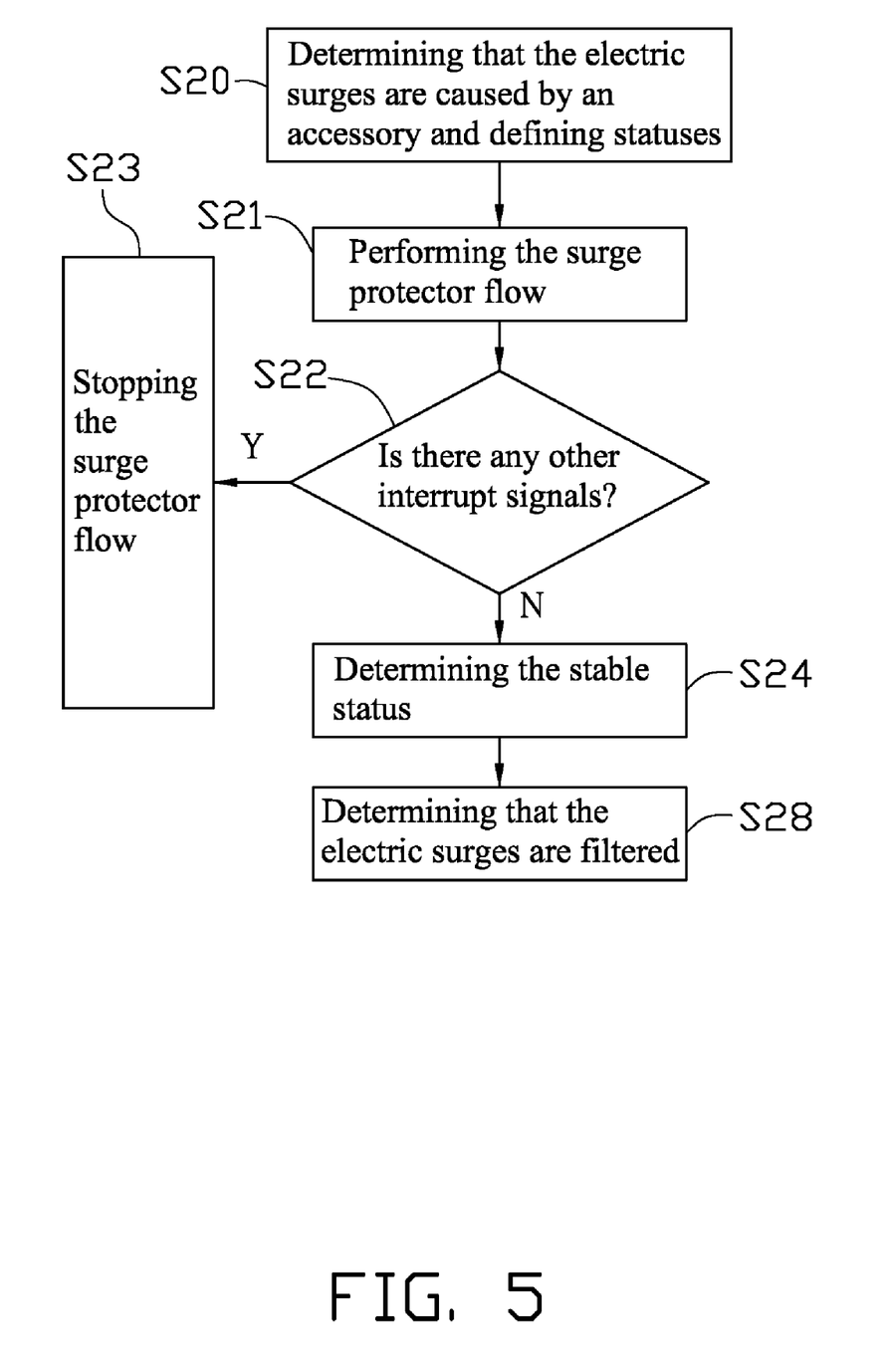
FIG. 5 is a first subsidiary flow chart of the method shown in FIG. 3, comprising a flow chart of a first detecting method.
Figure 6:
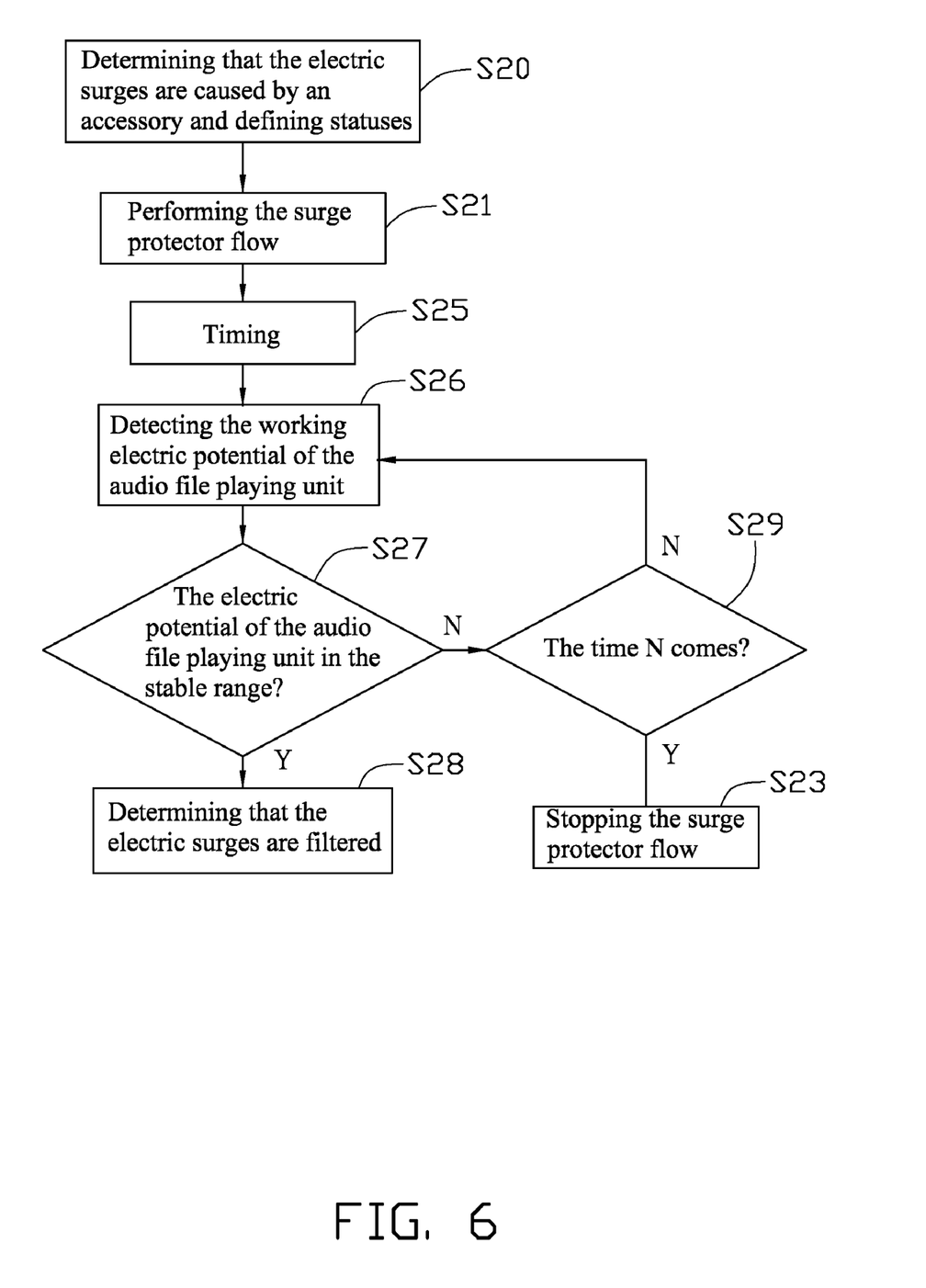
FIG. 6 is also the first subsidiary flow chart of the method shown in FIG. 3, but comprising a flow chart of a second detecting method.

Also referring to FIG. 5 and FIG. 6, the first subsidiary flow may include the following steps. First, the CPU 12 determines that the electric surges are caused by the accessory 90, and defines accessory connection statuses of the accessory 90 with the portable electronic device 200 (Step S20). Particularly, the status of completely separating the accessory 90 from the portable electronic device 200 (i.e., the status of no connection between the accessory 90 and the portable electronic device 200) is defined as an initial status, and the status of correctly and stably connecting the accessory 90 to the portable electronic device 200 is defined as a stable status. The acceptable range of the working electric potential of the audio file playing unit 80 in the stable status is defined as a stable electric potential range. The status of inserting the accessory 90 into the jack 804 and removing the accessory 90 from the jack 804 are defined as an interrupt status.

When the CPU 12 detects an interrupt signal in the jack 804, the CPU 12 determines an accessory is connected to the portable electronic device 200 and then performs the surge protector flow to filter the electric surges (Step S21). Afterwards, the CPU 12 can detect the connecting status of the accessory 90 during the electric surge filtering time N according to either of a first detecting method and a second detecting method.

Referring to FIG. 5, in the first detecting method, the CPU 12 first detects if there are any other interrupt signals generated during the electric surge filtering time N after Step S21 (Step S22). If the CPU 12 detects a second interrupt signal at the jack 804 during the time N, the CPU 12 determines that the accessory 90 is separated from the jack 804 when Step 21 is performed. Thus, the CPU 12 switches off the surge protection chip 23 to stop the surge protector flow to avoid unnecessary surge filtering operations (Step S23). If there is no other interrupt signal detected in the jack 804 during the time N, the CPU 12 determines that the accessory 90 and the portable electronic device 200 are in the stable status during the time N (Step S24), and further determines that the electric surges are completely filtered (Step S28). Thus, the first subsidiary flow can be ended.

Referring to FIG. 6, in the second detecting method, the CPU 12 activates the timer 18 to time after Step S21 (Step S25), and synchronously detects the working electric potential of the audio file playing unit 80 using the electric potential detector 14 in a predetermined frequency (Step S26). Particularly, the CPU 12 measures if the working electric potential of the audio file playing unit 80 is in the stable electric potential range (Step S27). If the electric potential of the audio file playing unit 80 is in the stable electric potential range, the CPU 12 determines that the accessory 90 is corrected connected to the portable electronic device 200 and the electric surges are completely filtered (Step S28). Thus, the first subsidiary flow can be ended. If the electric potential of the audio file playing unit 80 is not in the stable electric potential range, the CPU 12 further determines if the predetermined electric surge filtering time N comes using the timer 18 (Step S29). If the time N has not come, the CPU 12 determines that the electric surges are not completely filtered, and continuously detects the electric potential of the audio file playing unit 80 in the predetermined frequency (i.e., skips to Step 26). If the time N has come, the CPU 12 determines that the accessory 90 is separated from the jack 804 during the time N, and switches off the surge protection chip 23 to stop performing the surge protector flow (i.e., skips to Step S23). Additionally, the steps of the first and second detecting methods can also be synchronously performed.

Figure 7:
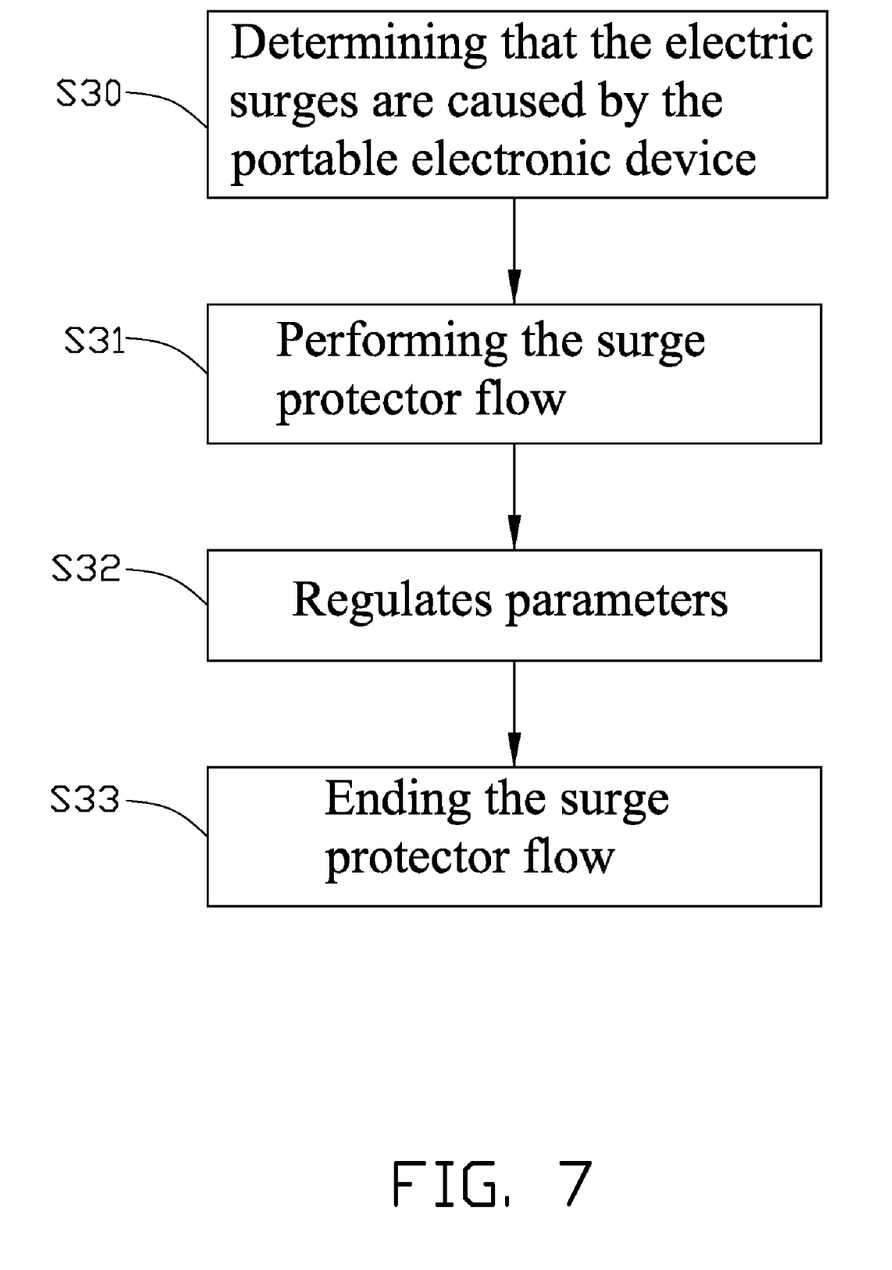
FIG. 7 is a second subsidiary flow chart of the method shown in FIG. 3.

Also referring to FIG. 7, the second subsidiary flow may include the following steps. First, the CPU 12 determines that the electric surges are caused by the portable electronic device 200 itself (Step S30), and performs the surge protector flow to filter the electric surges (Step S31). Afterwards, the CPU 12 regulates some relative parameters of the played audio files (e.g., the volume) to improve the playing quality (Step S32). Finally, the second subsidiary flow is ended.

In the present disclosure, the surge protector device 100 can detect electric surges generated in the portable electronic device 200, determine the kind of the current electric surges, and filter different kinds of electric surges according to different corresponding methods. Furthermore, the surge protection method according to the exemplary embodiment includes steps of detecting if accessories are separated from the portable electronic device 200 when filtering the electric surges, such that the useless surge filtering operations can be stopped in time.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A portable electronic device, comprising:
   an audio file playing unit; and
   a surge protector device connected to the audio file playing unit, wherein the surge protector device includes a protector module connected to an audio file playing unit and a processor module connected to the protector module and the audio file playing unit, and the processor module detects electric surges in the audio file playing unit and controls the protector module to filter the detected electric surges when the audio file playing unit plays audio files; and
   wherein the protector module includes a surge protection chip, a control connector, an input connector, and two output connectors, the surge protection chip being a transistor having two sources, two gates and two drains; and the sources are both grounded, the gates are both connected to the processor module via the control connector, the drains are both connected to the input connector, and the output connectors are respectively connected to the drains, such that the surge protection chip is connected to the processor module and the audio file playing unit, and the processor module controls the surge protection chip to filter electric surges in the audio signals played by the audio file playing unit.

2. The portable electronic device as claimed in claim 1, wherein the processor module includes a CPU and an electric potential detector connected to the CPU and the audio file playing unit, the CPU detecting electric surges in the audio file playing unit using the electric potential detector.

3. The portable electronic device as claimed in claim 2, wherein the processor module further includes a switch, the CPU connected to the protector module via the switch to control the protector module.

4. The portable electronic device as claimed in claim 1, wherein the audio file playing unit is connected to the input connector and the two output connectors, such that the audio signals played by the audio file playing unit pass through the input connector and are respectively outputted from the two output connectors.

5. The portable electronic device as claimed in claim 4, wherein the protector module further includes two capacitors, one capacitor having one pole connected to one drain and another pole connected to the first output connector, and another capacitor having one pole connected to another drain and another pole connected to the second output connector.

6. The portable electronic device as claimed in claim 1, wherein the audio file playing unit includes a left sound channel circuit and a right sound channel circuit respectively connected to the two output connectors.

7. The portable electronic device as claimed in claim 2, wherein the protector module further includes a timer connected to the CPU to time the interval of filtering the electric surges.

8. The portable electronic device as claimed in claim 2, wherein the audio file playing module includes a jack connected the electric potential connector, the left sound channel circuit and the right sound channel circuit.

9. The portable electronic device as claimed in claim 1, further comprising a storage module connected to the processor module.

10. A method for using a portable electronic device to play audio files, comprising:
    using the portable electronic device to play audio files;
    detecting if there are any electric surges generated in the portable electronic device when playing audio files;
    determining the kinds of the detected electric surges; and
    filtering the detected electric surges according to the kinds of the detected electric surges; wherein the step of filtering the detected electric surges includes:
    using a surge protection chip to filter the electric surges;
    synchronously timing a predetermined electric surge filtering time
    detecting the status of the surge protection chip at a predetermined frequency in the electric surge filtering time and
    returning to filter the electric surges if the surge protection chip is turned off during the electric surge filtering time, and performing the following steps according to the kinds of the electric surges if the surge protection chip stays turned on during the electric surge filtering time.

11. The method as claimed in claim 10, wherein the detected electric surges are filtered by an NTZD3154N transistor.

12. The method as claimed in claim 10, further comprising a step of detecting the connecting status of an accessory connected to the portable electronic device in the electric surge filtering time, and stopping to the filter electric surges when the accessory is separated from the portable electronic device in the electric surge filtering time.

13. The method as claimed in claim 12, wherein the connecting status of the accessory is detected by detecting signals generated by connecting or separating operation between the portable electronic device and the accessory.

14. The method as claimed in claim 12, wherein the connecting status of the accessory is detected by measuring the electric potential of the audio file playing unit.

15. The method as claimed in claim 10, further comprising a step of regulating parameters of the played audio files.

* * * * *